(12) United States Patent
Chen et al.

(10) Patent No.: US 11,127,923 B2
(45) Date of Patent: Sep. 21, 2021

(54) DISPLAY DEVICE

(71) Applicant: Wuhan China Star Optoelectronics Semiconductor Display Technology Co., Ltd., Wuhan (CN)

(72) Inventors: Jifeng Chen, Wuhan (CN); Bao Chen, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 113 days.

(21) Appl. No.: 16/603,243

(22) PCT Filed: Apr. 25, 2019

(86) PCT No.: PCT/CN2019/084167
§ 371 (c)(1),
(2) Date: Oct. 7, 2019

(87) PCT Pub. No.: WO2020/124917
PCT Pub. Date: Jun. 25, 2020

(65) Prior Publication Data
US 2020/0194716 A1 Jun. 18, 2020

(30) Foreign Application Priority Data
Dec. 18, 2018 (CN) .......................... 201811551181.1

(51) Int. Cl.
*H01L 51/52* (2006.01)
*H01L 27/32* (2006.01)
(Continued)

(52) U.S. Cl.
CPC ...... *H01L 51/5246* (2013.01); *G02F 1/13338* (2013.01); *G02F 1/13394* (2013.01); *G02F 1/133512* (2013.01); *G02F 1/136286* (2013.01); *H01L 27/323* (2013.01); *H01L 27/3246* (2013.01); *H01L 27/3272* (2013.01); *H01L 27/3276* (2013.01); *H01L 27/3283* (2013.01);
(Continued)

(58) Field of Classification Search
CPC combination set(s) only.
See application file for complete search history.

(56) References Cited

U.S. PATENT DOCUMENTS

2017/0373281 A1* 12/2017 Park ................... H01L 51/5281
2019/0166696 A1* 5/2019 Lin ......................... G09F 9/301
(Continued)

FOREIGN PATENT DOCUMENTS

| CN | 2626973 | 7/2004 |
| CN | 101231987 | 7/2008 |

(Continued)

*Primary Examiner* — Mounir S Amer

(57) ABSTRACT

The present disclosure provides a display device, the display device including a first functional member; a second functional member, including a support portion disposed on a surface oriented to the first functional member. Because of the structure, when the display device is deformed, such as the optical adhesive layer deformed to a certain degree, the support portion which disposed on the first functional member will in contact with the second functional member functions to support, at this point, the adhesive layer will not continue to squeeze the adhesive out, so collapse will not occur.

17 Claims, 12 Drawing Sheets

(51) Int. Cl.
*G02F 1/1339* (2006.01)
*G02F 1/1333* (2006.01)
*G02F 1/1335* (2006.01)
*G02F 1/1362* (2006.01)

(52) U.S. Cl.
CPC ...... *H01L 27/3288* (2013.01); *H01L 51/5275* (2013.01); *H01L 51/5284* (2013.01)

(56) References Cited

U.S. PATENT DOCUMENTS

2020/0251679 A1* 8/2020 Ha .................. H01L 51/524
2020/0272204 A1* 8/2020 Su .................. G09F 9/301

FOREIGN PATENT DOCUMENTS

| CN | 202166809 | 3/2012 |
|----|-----------|--------|
| CN | 202344994 | 7/2012 |
| CN | 103034350 | 4/2013 |

* cited by examiner

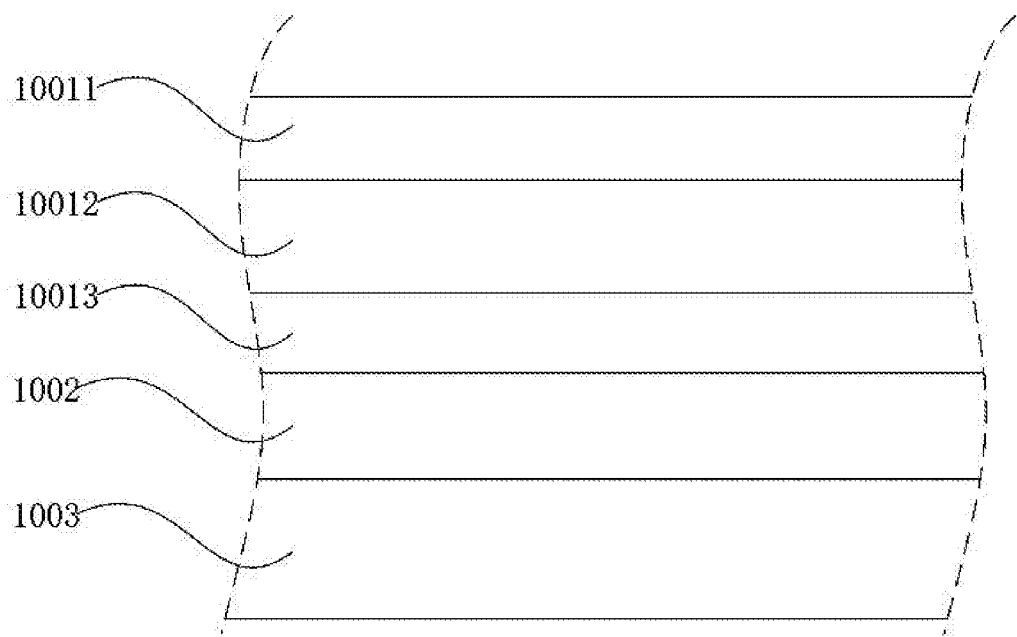
FIG. 10 (1)
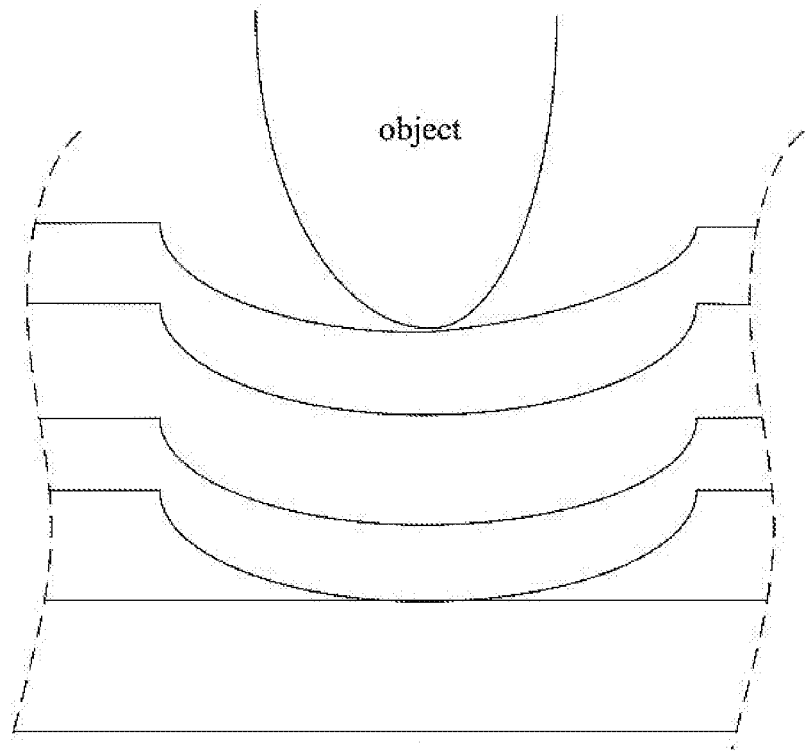
FIG. 10 (2)

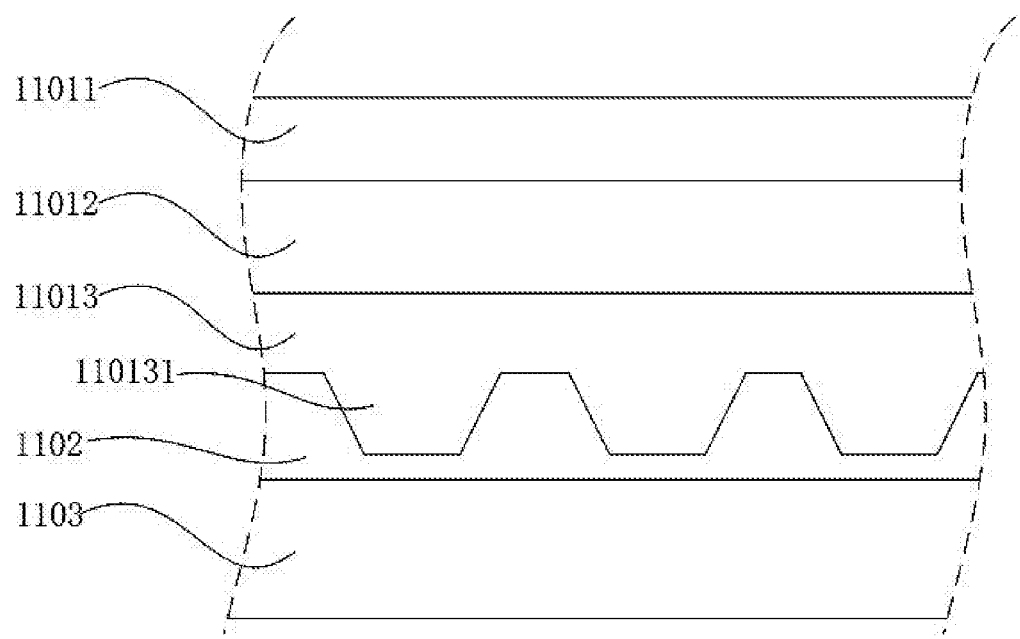
FIG. 11 (1)
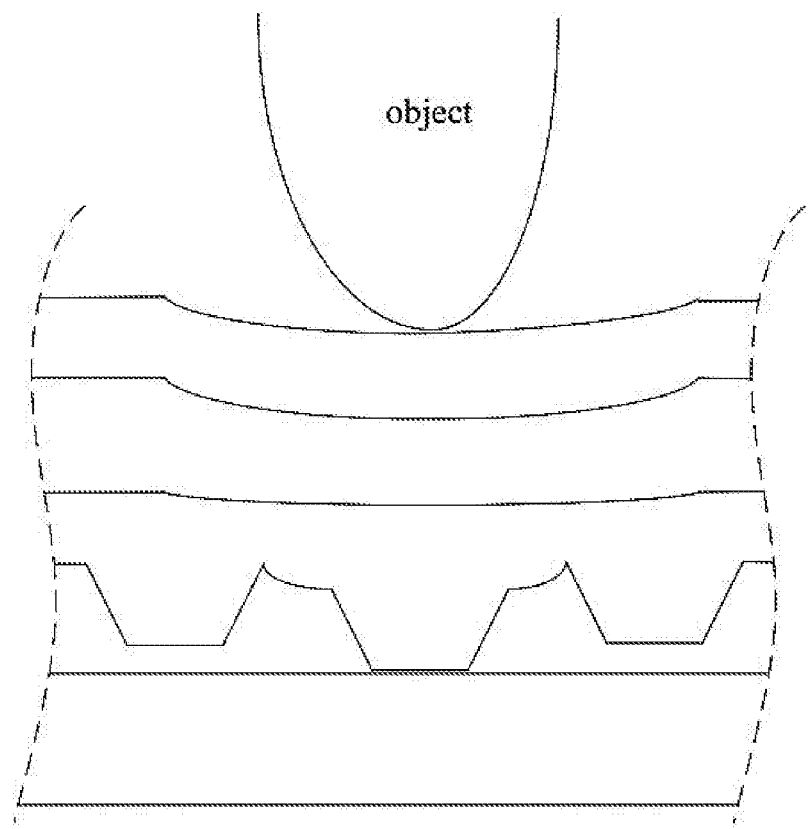
FIG. 11 (2)

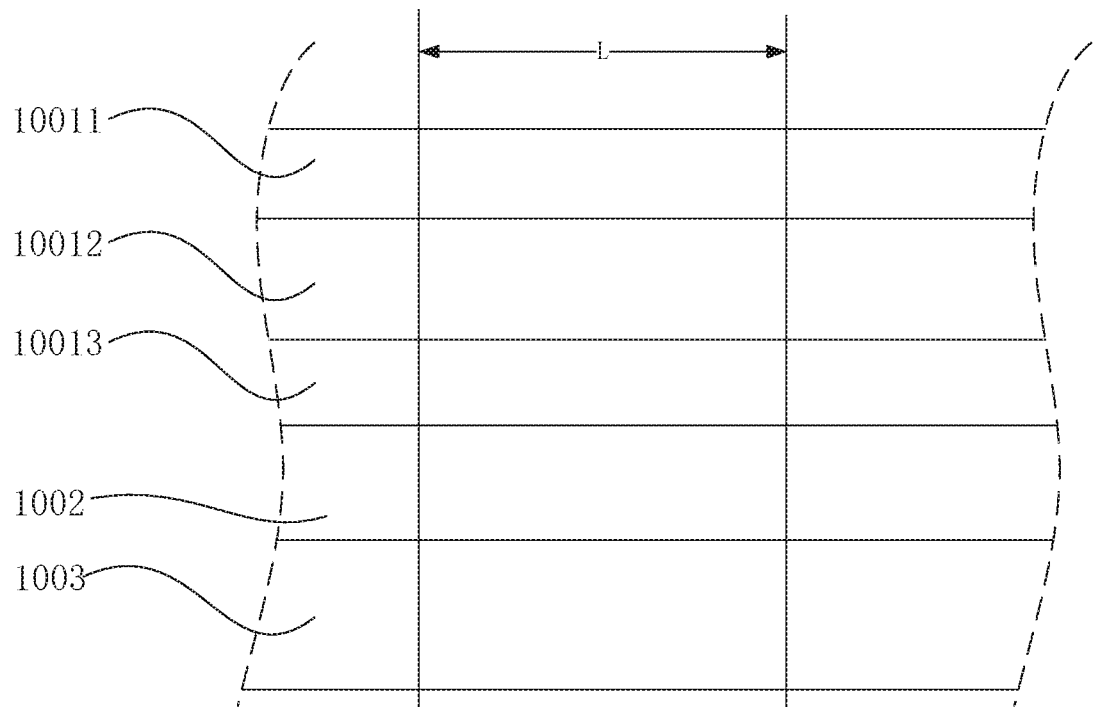
FIG. 12 (1)
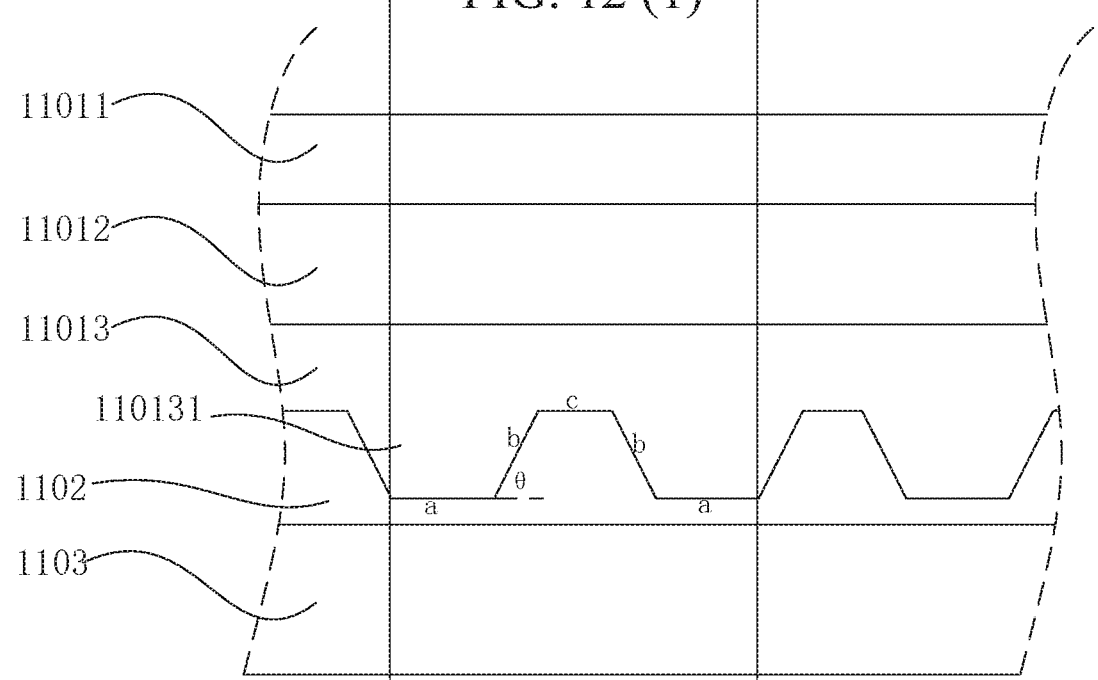
FIG. 12 (2)

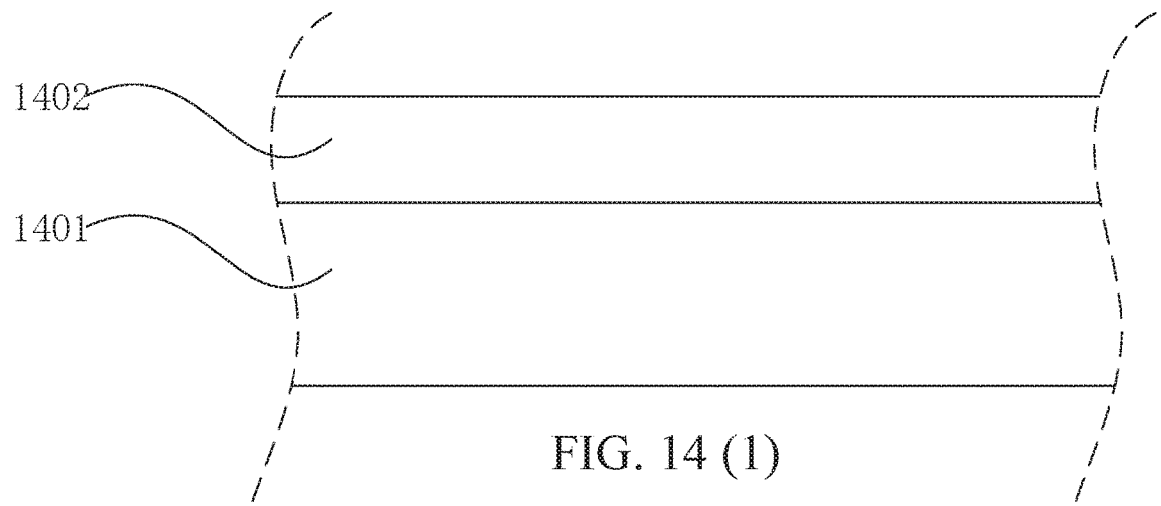
FIG. 14 (1)
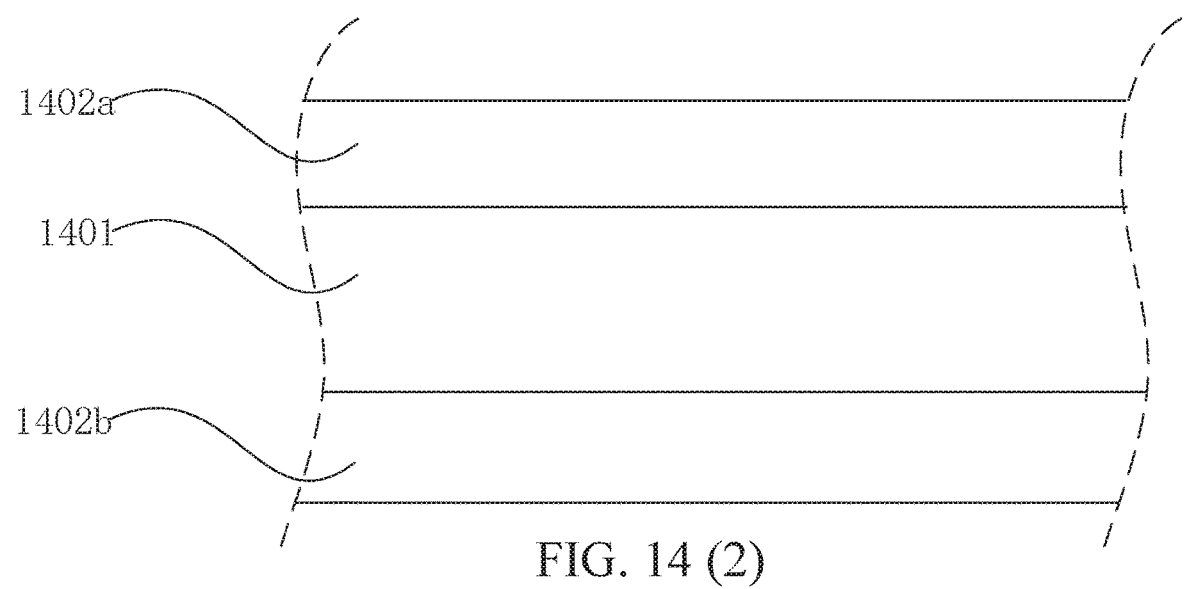
FIG. 14 (2)

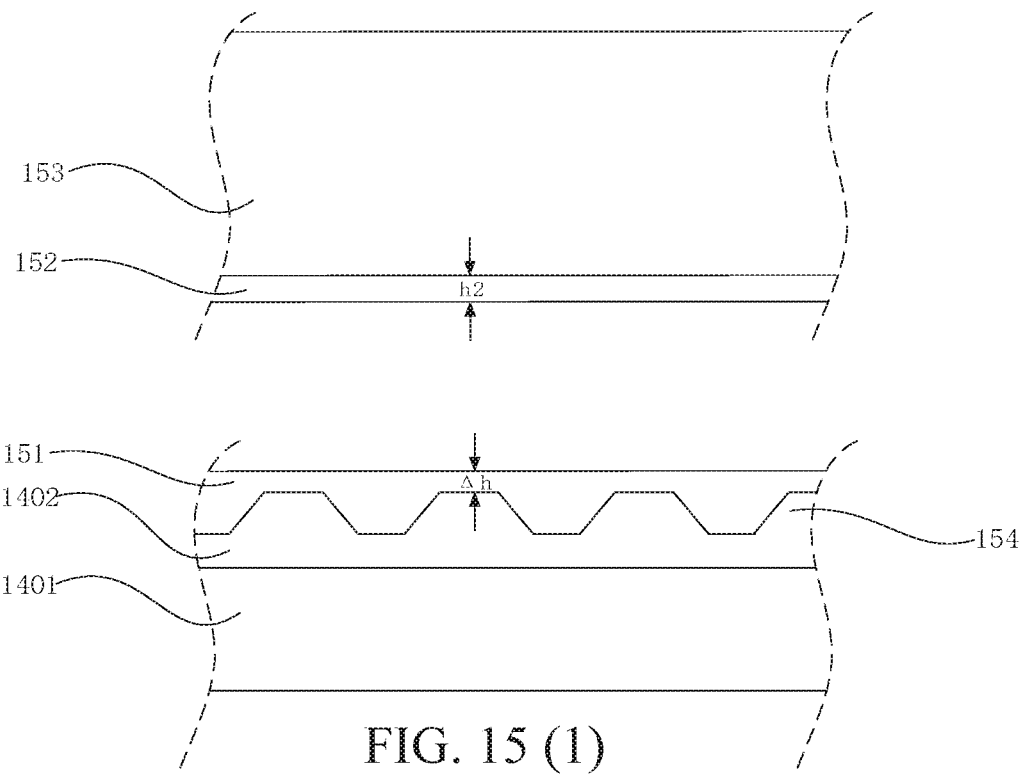
FIG. 15 (1)
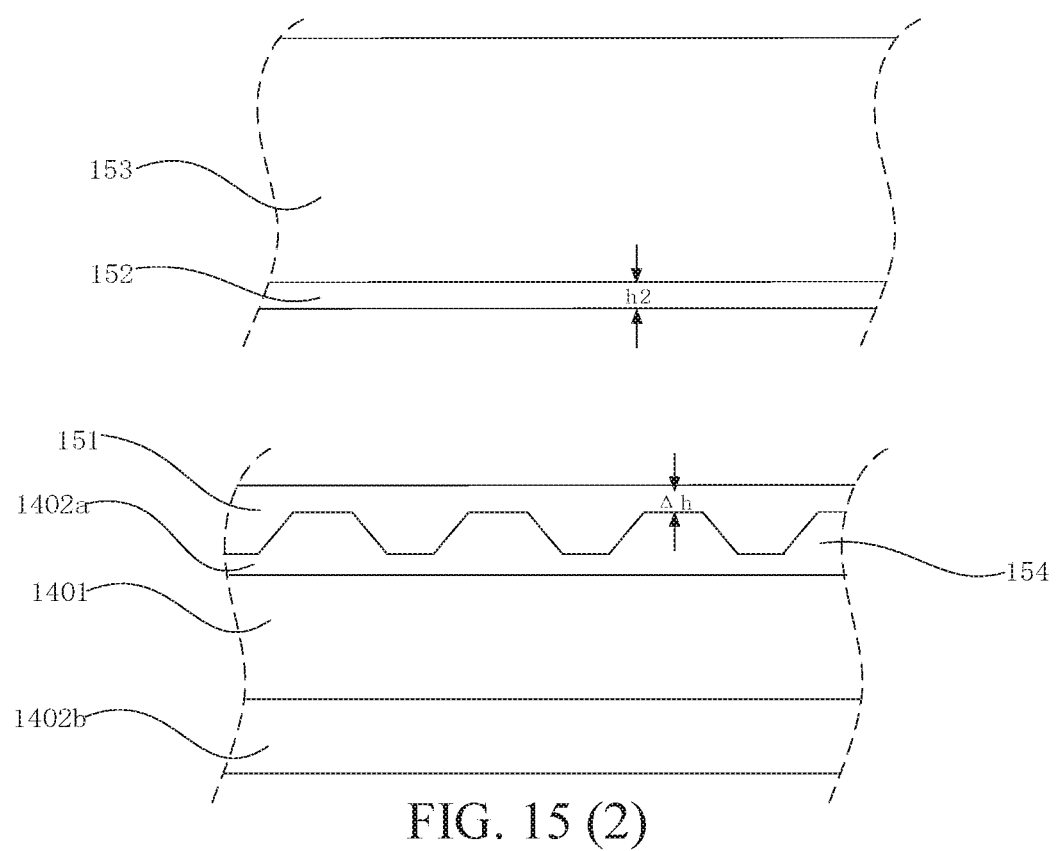
FIG. 15 (2)

DISPLAY DEVICE

RELATED APPLICATIONS

This application is a National Phase of PCT Patent Application No. PCT/CN2019/084167 having International filing date of Apr. 25, 2019, which claims the benefit of priority of Chinese Patent Application No. 201811551181.1 filed on Dec. 18, 2018. The contents of the above applications are all incorporated by reference as if fully set forth herein in their entirety.

FIELD AND BACKGROUND OF THE INVENTION

The present disclosure relates to the field of display technology, especially to a display device.

A surface of a prior art display device is a protective cover, a polarizer, or a touch panel which are bonded by an optical adhesive. When the protective cover of the display device is deformed, the optical adhesive will also be deformed. If the deformation of the optical adhesive increases to cause the optical adhesive collapses, the polarizer or the touch panel will be damaged.

Therefore, there is a technical problem that the optical adhesive collapses when the display device is deformed.

SUMMARY OF THE INVENTION

The present disclosure provides a display device to solve the technical problem that the optical adhesive collapses when the display device is deformed.

To solve the problems as mentioned above, the present disclosure provides the technical solutions are as follows:

an embodiment of the present disclosure provides a display device, including:

a first functional member;

a second functional member including a support portion disposed on a surface oriented to the first functional member, the support portion used for supporting the first functional member when the display device is deformed;

an adhesive layer, disposed between the second functional member and the first functional member; wherein the adhesive layer bonds the second functional member and the first functional member; a thickness of the adhesive layer is not less than a thickness of the support portion.

In the display device of the present disclosure, the adhesive layer is formed with at least one groove or one protrusion, a shape of the groove matches a shape of the support portion, a shape of the protrusion is complementary to the shape of the support portion.

In the display device of the present disclosure, the support portion is formed by protruding a surface of the second functional member.

In the display device of the present disclosure, the support portion is an independent member, the support portion is adhered to a surface of the second functional member.

In the display device of the present disclosure, the first functional member is disposed with another support portion on a surface of the first functional member toward the second functional member.

In the display device of the present disclosure, the support portion of the second functional member is disposed corresponding to the support portion of the first functional member.

In the display device of the present disclosure, the support portion of the second functional member is alternately arranged with the support portion of the first functional member.

In the display device of the present disclosure, the support portion comprises a prismatic structure.

In the display device of the present disclosure, the display device comprises a display area, and the support portion is disposed in the display area.

In the display device of the present disclosure, an installation position of the support portion corresponds to an installation position of a pixel defining layer of a display panel in the display device.

In the display device of the present disclosure, the display device is an organic light emitting diode display along a direction perpendicular to a surface of the display device, the support portion coincides with a projection of the pixel defining layer on a surface of the display device.

In the display device of the present disclosure, an installation position of the support portion corresponds to an installation position of a data line of a display panel in the display device.

In the display device of the present disclosure, the display device is a liquid crystal display, along a direction perpendicular to a surface of the display device, the support portion coincides with a projection of the data line on a surface of the display device.

In the display device of the present disclosure, an installation position of the support portion is the same as an installation position of a light shielding layer of a display panel in the display device.

In the display device of the present disclosure, in a direction perpendicular to the surface of the display device, the support portion coincides with a projection of the light shielding layer on a surface of the display device.

In the display device of the present disclosure, the support portion includes a columnar structure.

In the display device of the present disclosure, the support portion includes a prismatic array structure.

In the display device of the present disclosure, the support portion includes a columnar array structure.

In the display device of the present disclosure, the first functional member is a protective cover disposed on a surface of the display device, the second functional member is a polarizer or a touch panel near the protective cover.

In the display device of the present disclosure, the first functional member is a polarizer near a surface of the display device and the second functional member is a protective cover disposed on a surface of the display device.

The beneficial effects of the present disclosure: The present disclosure provides a novel display device. The display device including a first functional member, a second functional member, including a support portion disposed on a surface oriented to the first functional member, the support portion used for supporting the first functional member when the display device is deformed, an adhesive layer disposed between the second functional member and the first functional member. Wherein the adhesive layer bonds the second functional member and the first functional member. A thickness of the adhesive layer is not less than a thickness of the support portion. Because of the thickness of the adhesive layer is not less than the thickness of the support portion, when the display device is not deformed, the adhesive layer which disposed between the support portion and the functional member functions to adhesive. When the display is disformed, such as the optical adhesive layer deformed to a certain degree. The support portion which disposed on the first functional member will in contact with the second functional member functions to support. At the same time, the adhesive layer will not continue to squeeze the adhesive out, so do not the collapse occur. Therefore, solves the technical problem that the optical adhesive collapse caused by excessive deformation of the prior art display.

BRIEF DESCRIPTION OF THE SEVERAL VIEWS OF THE DRAWINGS

The accompanying figures to be used in the description of embodiments of the present invention will be described in brief to more clearly illustrate the technical solutions of the embodiments. Obviously, the accompanying figures described below are only part of the embodiments of the present invention, from which figures those skilled in the art can derive further figures without making any inventive efforts.

FIGS. 10(1) and 10(2) are force deformation schematic diagrams of a prior art display device.

FIGS. 11(1) and 11(2) are force deformation schematic diagrams of the display device according to an embodiment of the present disclosure.

FIGS. 12(1) and 12(2) are adhesive surface schematic diagrams of an embodiment of the present disclosure.

FIGS. 14(1) and 14(2) are schematic diagrams of a plastic cover according to an embodiment of the present disclosure.

FIGS. 15(1) and 15(2) are first combination schematic diagrams of the display device according to an embodiment of the present disclosure.

DESCRIPTION OF SPECIFIC EMBODIMENTS OF THE INVENTION

Figure 1:
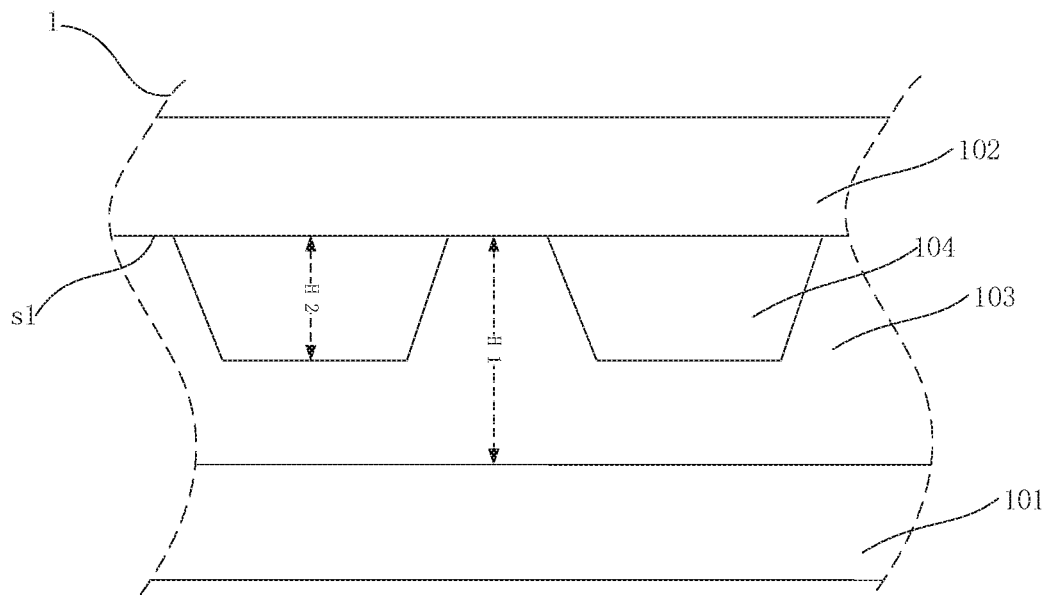
FIG. 1 is a first schematic cross-sectional diagram of a display device according to an embodiment of the present disclosure.

The following description of the various embodiments is provided to illustrate the specific embodiments. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

For the technical problem that the optical adhesive collapse caused by excessive deformation of the prior art display, the embodiments of the present disclosure can solve the technical problem.

As shown in FIG. 1, a display device 1 of the present disclosure including:

a first functional member 101;

a second functional member 102 including a support portion 104 disposed on a surface s1 oriented to the first functional member 101, the support portion 104 used for supporting the first functional member 101 when the display device 1 is deformed;

an adhesive layer 103 disposed between the second functional member 102 and the first functional member 101; wherein the adhesive layer 103 bonds the second functional member 102 and the first functional member 101; a thickness H1 of the adhesive layer 103 is not less than a thickness H2 of the support portion 104.

As shown in FIG. 1, the thickness H1 of the adhesive layer 103 is a maximum thickness of the adhesive layer 103, correspondingly, the thickness H2 of the support portion 104 is a maximum thickness of the support portion 104.

In the embodiment, the display device including a first functional member, a second functional member including a support portion disposed on a surface oriented to the first functional member, the support portion used for supporting the first functional member when the display device is deformed, an adhesive layer disposed between the second functional member and the first functional member, wherein the adhesive layer bonds the second functional member and the first functional member, a thickness of the adhesive layer is not less than a thickness of the support portion. Because of the thickness of the adhesive layer is not less than the thickness of the support portion, when the display device is not deformed, the adhesive layer which disposed between the support portion and the functional member functions to adhesive. When the display is disformed, such as the optical adhesive layer deformed to a certain degree, the support portion which disposed on the first functional member will in contact with the second functional member functions to support, at this point, the adhesive layer will not continue to squeeze the adhesive out, so do not the collapse occur, solves the technical problem that the optical adhesive collapse caused by excessive deformation of the prior art display.

The adhesive layer 103 may be formed of a material in a fixed state, which is formed by force transmission, or may be formed of a liquid material such as optical adhesive.

In an embodiment of the present disclosure, the adhesive layer 103 is formed of a material in a fixed state, at this time, the adhesive layer 103 is formed with at least one groove or one protrusion, a shape of the groove matches a shape of the support portion, a shape of the protrusion is complementary to the shape of the support portion.

Methods of disposing the support portion 104 on the surface s1 of the second functional member 102 may be various. For example, directly processing such as patterning the second functional member 102 to form the support portion 104; or independently formed the support portion 104 and then adhered to the surface s1 of the second functional member 102 by using glue, such as optical adhesive.

Figure 2:
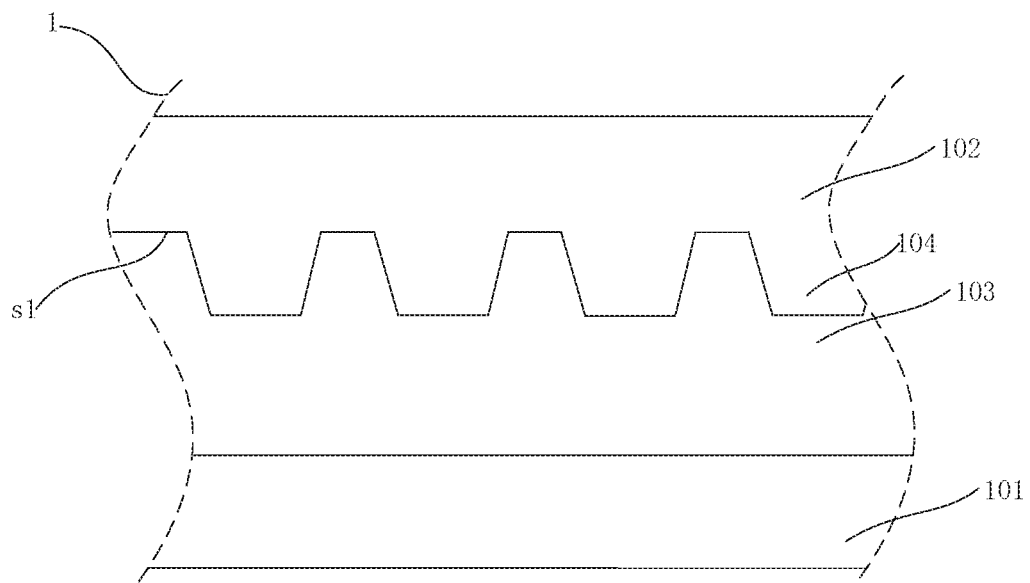
FIG. 2 is a second schematic cross-sectional diagram of the display device according to an embodiment of the present disclosure.

In an embodiment, as shown in FIG. 2, the second functional member 102 protrudes to form the support portion 104. For example, the second functional member 102 is patterned to form a protrusion, and the protrusion is used as the support portion 104.

Figure 3:
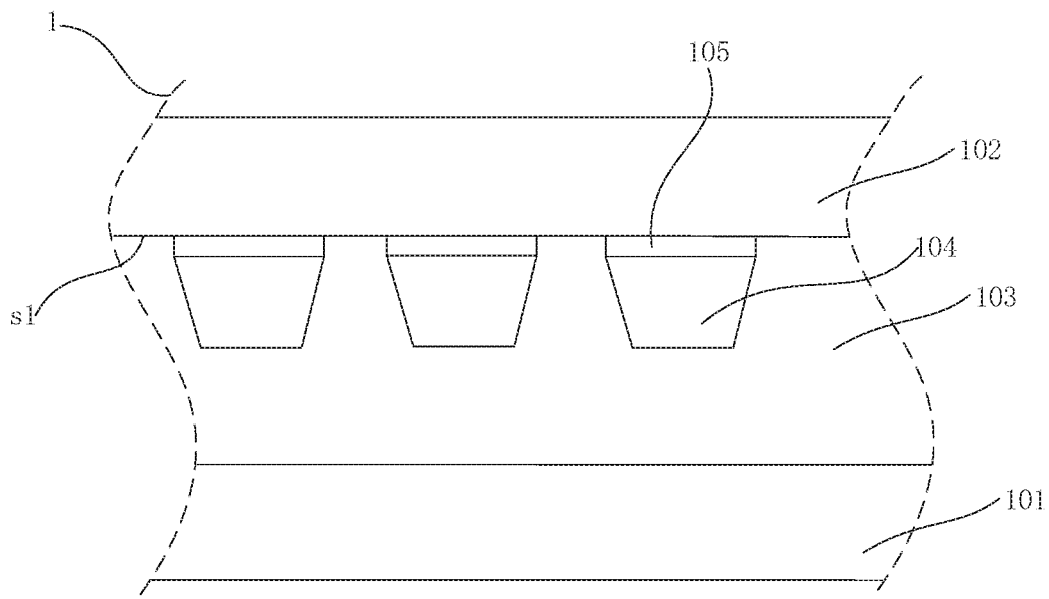
FIG. 3 is a third schematic cross-sectional diagram of the display device according to an embodiment of the present disclosure.

In an embodiment, as shown in FIG. 3, the support portion 104 is an independent member, and is adhered to the surface s1 of the second functional member 102 by a transparent adhesive 105 or the like such as an optical adhesive.

In an embodiment, the support portion 104 may be a doping material in a transparent adhesive such as an optical adhesive, so that the disposing of the support portion 104 and the disposing of the adhesive layer 103 can be completed by coating the transparent adhesive such as optical adhesive at one time, simplifying the manufacturing process of the display device.

In an embodiment, when the support portion 104 is an independent member, a hardness of the support portion 104 is greater than a hardness of the optical adhesive, smaller or greater than a hardness of a surface of the other functional members.

The support portion 14 can be disposed by different method in different regions of the display device, to compatible with different hardness or manufacturing process requirements.

For example, in an embodiment, the support portion 104 in the display area is formed by protruding the surface S1 of the second functional member 102, and the support portion 104 in the non-display area is formed independently.

In another embodiment, as for the flexible display device, the display area includes a bending area and a non-bending area. In the bending area, the support portion 104t is formed by protruding the surface S1 of the second functional member 102, to reduce the bending stiffness. In the non-bending area, the support portion 104 is formed independently.

In an embodiment, as shown in FIG. 1, the support portion 104 is disposed only on the surface s1 of the second functional member, which is disposed simple, only needs to process the surface of one functional member.

Figure 4:
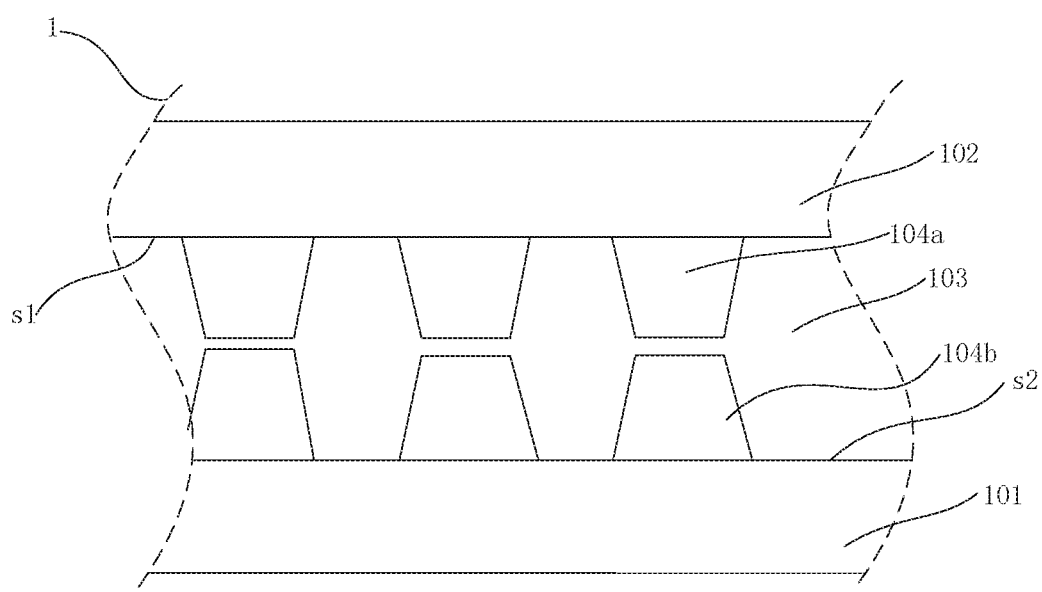
FIG. 4 is a fourth schematic cross-sectional diagram of the display device according to an embodiment of the present disclosure.

In an embodiment, as shown in FIG. 4, at least one strut portion 104b disposed on the surface s2 of the first functional member 101 and at least one support portion 104a disposed on the surface s1 of the second functional member 102. The at least one support portion 104a of the second functional member 102 is disposed corresponding to the at least one strut portion 104b of the first functional member 101. This disposition can further save the material of the adhesive layer.

Figure 5:
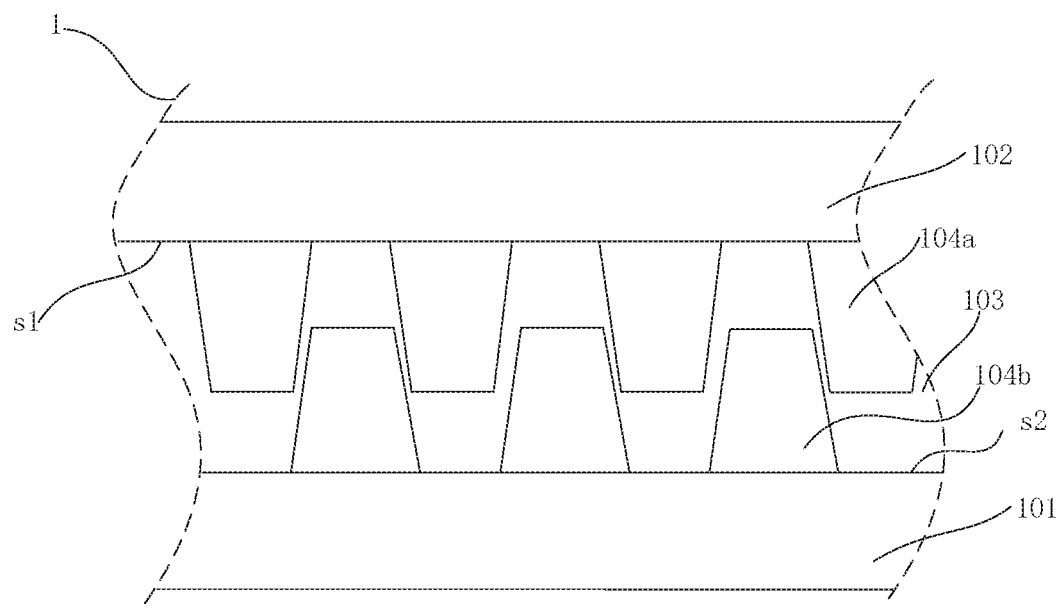
FIG. 5 is a fifth schematic cross-sectional diagram of the display device according to an embodiment of the present disclosure.

In an embodiment, as shown in FIG. 5, at least one strut portion 104b disposed on the surface s2 of the first functional member 101 and at least one support portion 104a disposed on the surface s1 of the second functional member 102. The at least one support portion 104a of the second functional member 102 is alternately arranged with the at least one strut portion 104b of the first functional member 101. This disposition can further reduce a total thickness of the display device.

Figure 6:
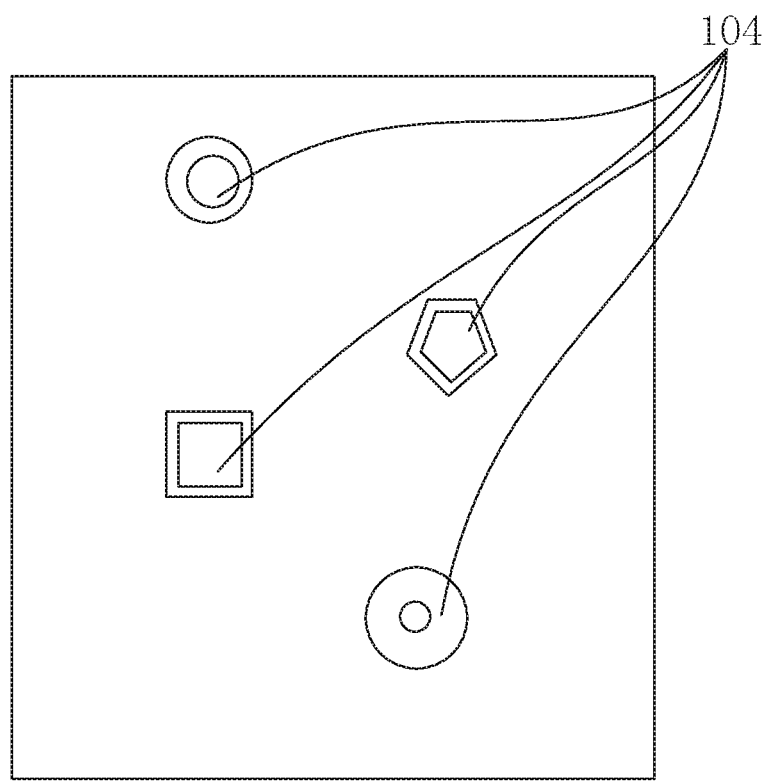
FIG. 6 is a first top view diagram of g a first functional member according to an embodiment of the present disclosure.

In an embodiment, as shown in FIG. 6, the support portion 104 includes at least one prismatic structure. A bottom surface of the prismatic structure may be any polygon or circular shape, the support portions in different positions may also have a prismatic structure with different bottom surfaces, so as to be compatible with the installation requirements. As shown in FIG. 6, the support portion 104 may be a prismatic structure with a quadrangular, a pentagon, or a circular bottom surface.

Figure 7:
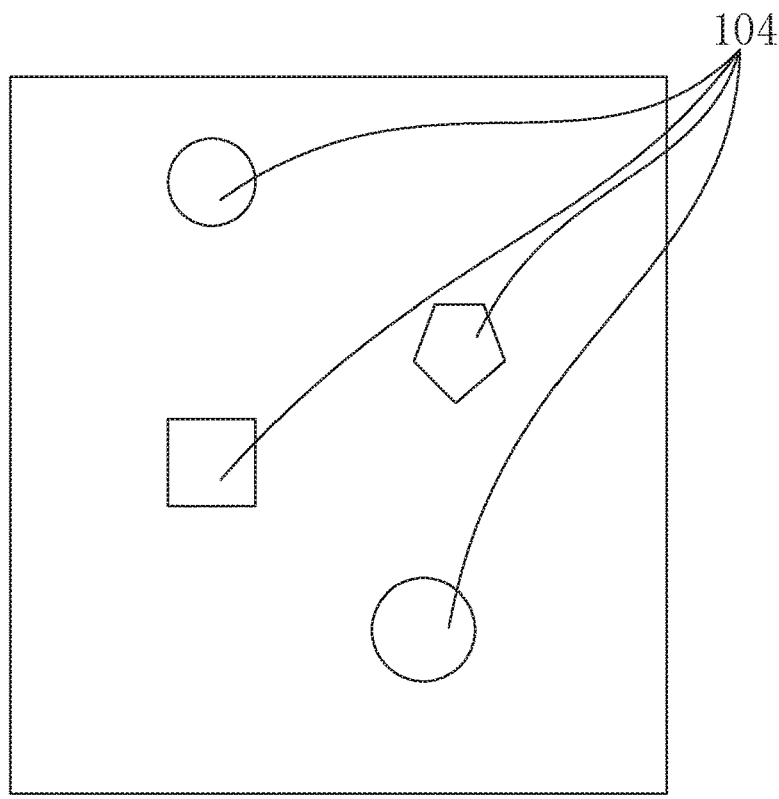
FIG. 7 is a second top view diagram of a first functional member according to an embodiment of the present disclosure.

In an embodiment, as shown in FIG. 7, the support portion 104 includes at least one columnar structure. A bottom surface of the columnar structure may be any polygon or circular shape, the support portions in different positions may also be a columnar structure with different bottom surfaces, so as to be compatible with the installation requirements. As shown in FIG. 7, the support portion 104 may be a columnar structure with a quadrangular, a pentagon, or a circular bottom surface.

Figure 8:
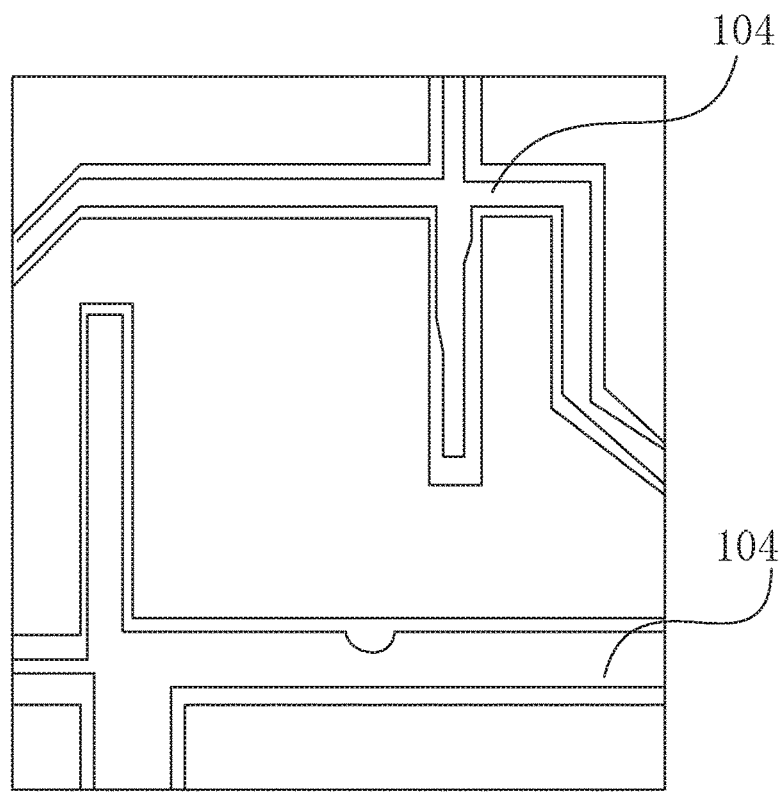
FIG. 8 is a third top view diagram of a first functional member according to an embodiment of the present disclosure.

In an embodiment, as shown in FIG. 8, the support portion includes at least one prismatic array structure. The prismatic array structures may be different in different positions, and size of bottom surfaces or top surfaces may be different to be compatible with the installation requirements. As shown in FIG. 8, size of the bottom surfaces or the top surfaces of the support portion 104 are different in different positions.

Figure 9:
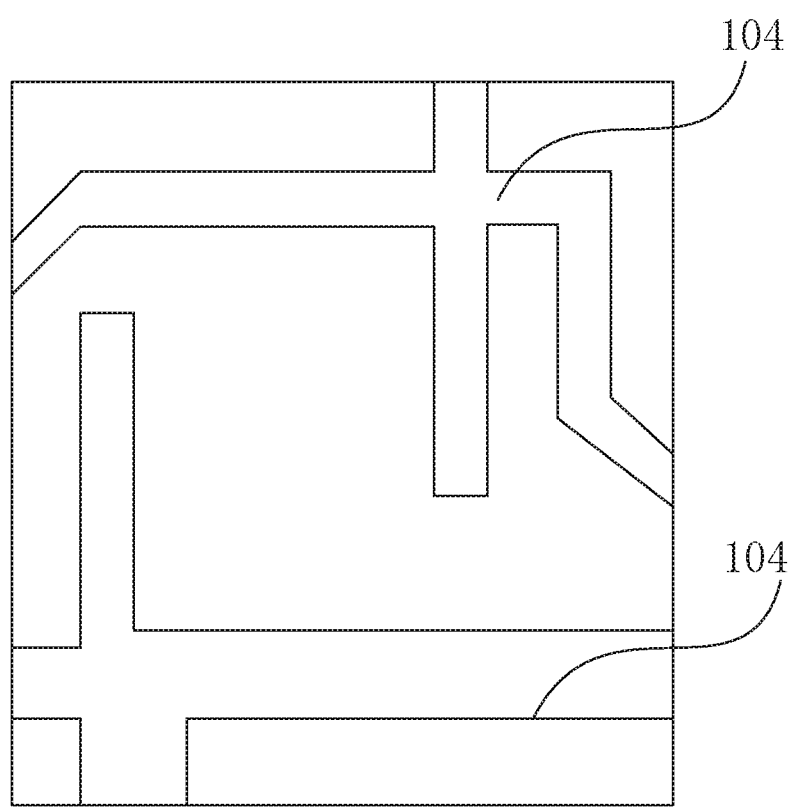
FIG. 9 is a fourth top view diagram of a first functional member according to an embodiment of the present disclosure.

In an embodiment, as shown in FIG. 9, the support portion includes at least one columnar array structure. The columnar array structure may be different at different positions, and size of a bottom surface or a top surface may be different to be compatible with the installation requirements. As shown in FIG. 9, size of the bottom surfaces or the top surfaces of the support portions 104 are different in different positions.

In an embodiment, an installation position of the support portion is related to an installation position of a pixel defining layer or a data line, of the display panel in the display device. Thus, light is reflected, or even caused the total internal reflection at a contact surface of the support portion 104 and the transparent adhesive layer 103, so that the aperture ratio and resolution of the display device can be increased.

In an embodiment, the display device is a liquid crystal display, along a direction perpendicular to the surface of the display device, the support portion coincides with a projection of the data line on a surface of the display device.

In an embodiment, the display device is an organic light emitting diode display, along a direction perpendicular to a surface of the display device, the support portion coincides with a projection of the pixel defining layer on a surface of the display device.

In an embodiment, an installation position of the support portion is the same as an installation position of a light shielding layer, the black matrix layer, of a display panel in the display device. Thus, light is reflected, or even caused total internal reflection at a contact surface of the support portion 104 and the transparent adhesive layer 103. Through the correspondence of the support portion and the light shielding layer, the aperture ratio and resolution of the display device increased.

In an embodiment, along the direction perpendicular to a surface of the display device, the support portion coincides with a projection of the black matrix layer on a surface of the display device.

In an embodiment, because the optical adhesive of the surface portion is most heavily stressed, the support portion 104 may be disposed only on a surface portion of the display device, or may be disposed at other positions where dispose the optical adhesive, of the display device.

In an embodiment, the first functional member is a protective cover disposed on a surface of the display device, the second functional member is a polarizer or a touch panel near the protective cover.

In an embodiment, the first functional member is a polarizer, the second functional member is a protective cover disposed on a surface of the display device.

In an embodiment, the protective cover has different embodiments in different types of display device products, such as a glass cover or a plastic cover.

The display device provided by the present application may be a liquid crystal display (LCD) or an active organic light emitting diode (AMOLED) display. Active organic light emitting diode (AMOLED) displays have the advantages of ultra-high response speed, wide color gamut, high contrast, etc., and have been considered as the next generation display after liquid crystal. The AMOLED can be fabricated on a flexible substrate, so that the display has the characteristics of bendable and foldable. The flexible displays bring more applicability and functionality to the displays.

The most difference between the flexible AMOLED display and the general flat display in the module structure is that cannot use the cover glass as a general flat display. Because the bendability of glass is low and is fragile during bending process. The cover window materials used in present flexible AMOLED displays are all CPI plastic materials. However, the display products are required a surface with scratch-resistant and impact-resistant, and the plastic material is not as hard as the glass. Therefore, the general commercial plastic cover be coated with a hard scratch-resistant material, Hard Coating (HC), on a surface of the plastic. Such a cover structure can pass up to 8H or more of the pencil hardness test.

However, after actually using the plastic cover in the laminated structure of the AMOLED display, the passed pencil hardness test was greatly reduced to 1H or less. Only passed the 8H hardness test when separately test the plastic cover. The main reason is that the optical transparent adhesive (OCA) used in the layers of the AMOLED display is very soft, so that the degree of the depression after press the pencil is worse than the case of using the glass cover. In order to solve the technical problem above, it should be helpful to increase the thickness of the hard coating. However, increasing the thickness of the hard coating also increases the flexural rigidity, further reducing the bendability of the display, which is not an ideal solution.

The present embodiment provides a columnar support structure that effectively improves the surface hardness and the falling ball impact resistance of the flexible display, at the same time, maintain the original bendability of the flexible display.

Based on spirit of the present disclosure, the present embodiment provides a structure for improving the surface hardness and the falling ball impact resistance of the flexible AMOLED display, and the structure does not affect the original bending original bendability of the flexible display. Mainly by forming the columnar support structure on each plastic film layer nearly the upper surface of the display, when the object collides and squeezes, to avoid causing the collapse of the OCA adhesive material between the plastic film layers.

The film layer of the display device of the present disclosure is disposed as shown in FIG. 10 (1), including a plastic cover 1001, an optical adhesive 1002, and a polarizer 1003. The plastic cover 1001 includes a first scratch-resistant material layer 10011, a plastic material film layer 10012 and a second scratch-resistant material layer 10013. The simulation results of the falling ball impact test are shown in FIG. 10 (2). When the object, such as pencil or ball, is pressed down to the lowest point, the optical adhesive 1002 inside the laminated structure of the display is forced to be squeezed out, causing the stress wave to be directly transmitted to the OLED component area at below, causing damage and failed.

The optical adhesive 1002 is the mainly reason of the flexible display screen being difficult to withstand the forward compressive stress. However, the presence of the optical adhesive 1002 is necessary, which not only sticking the film layers, but also release the stress in the bent state, reduce the stress of the bending state components.

As shown in FIG. 11 (1), in order to maintain the original bending performance of the OCA layer, at the same time, the surface deformation does not occur under the action of the positive force. The display device provided in this embodiment includes a plastic cover 1101, (ie, the first functional member mentioned above), an optical adhesive 1102, (ie, a transparent adhesive layer mentioned above), and a polarizer 1103, (ie, the second functional member mentioned above), the plastic cover plate 1101 includes a first scratch-resistant material layer 11011, a plastic material layer 11012 and a second scratch-resistant material layer 11013, the second scratch-resistant material layer 11013, are formed with a columnar structure 110131 (ie, the support portion mentioned above). As shown in FIG. 11 (2), in a certain degree, when an object, such as pencil, pressed against a surface of the display on the top, the optical adhesive 1102 located below cannot depressed because of the support of the columnar structure 110131, and restricted the depression formed on the top. Further enhances the ability of the surface to withstand the squeezing or impact of objects.

At the same time, another advantage of the columnar structure proposed in the embodiment is that the adhesion area between the optical adhesive (OCA) and the plastic film is increased, so that the adhesion between layers of the inner of display is improved, the peeling risk of folding step will also decrease. Similarly providing a portion L. As shown in FIG. 12 (1), in a plastic film which having no columnar structure, a contact length with the OCA is 2a+2b cos θ+c. As shown in FIG. 12 (2), in a plastic film having columnar structure, a contact length with the OCA is 2a+2b+c. It can be seen that the columnar structure geometrically increasing the contact area of the OCA, thereby reducing the risk of de-adhesive.

Figure 13:
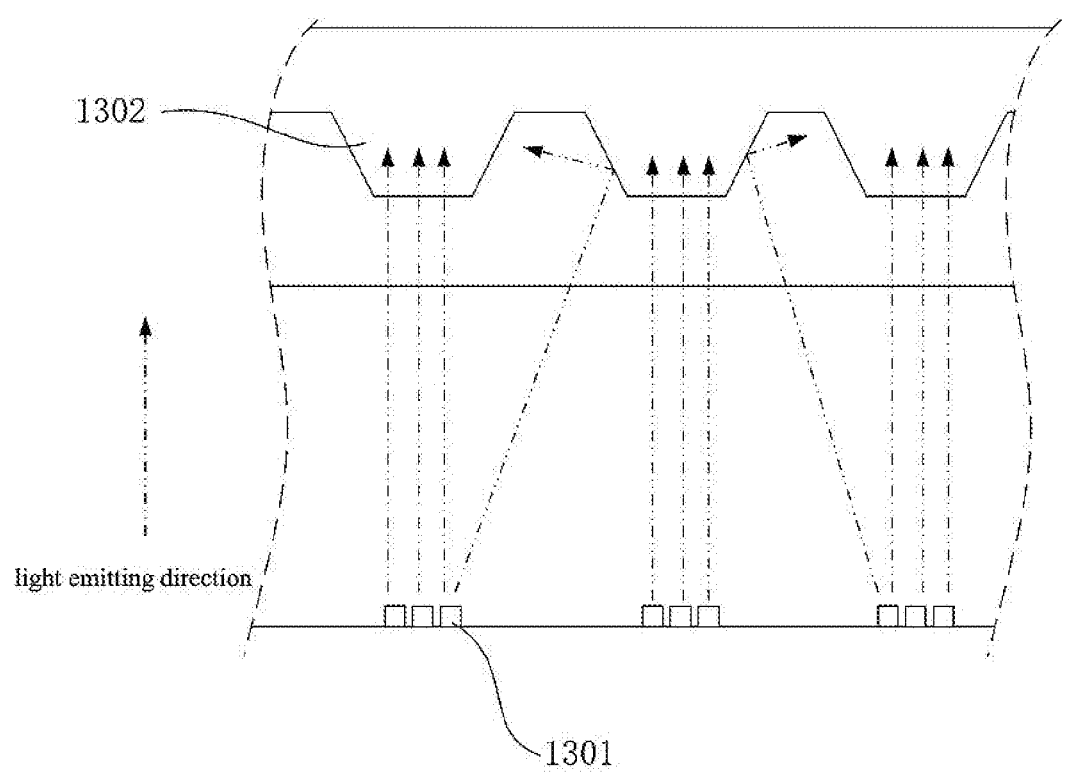
FIG. 13 is a ray schematic diagram of the display device according an embodiment of the present disclosure.

As shown in FIG. 13, in an embodiment, a refractive index of columnar structure may different from a refractive index of the OCA. Utilizing this feature, to manufacturing the columnar array structure 1302 periodic arranged with display pixels 1301. The light emitted from the display pixel 1301 is caused to form total internal reflection on a side of the columnar array structure 1302, as the light passes through the columnar array structure 1302. Therefore, the light is confined to a certain area, reducing the occurrence of stray light mixing and improving the resolution.

As shown in FIG. 14, the plastic cover includes a substrate 1401 and a reinforced coating film 1402. The substrate 1401 is generally made of colorless polyimide (CPI), and the reinforced coating film 1402 can be used for single-sided coating (Single-sided hard coating (HC). As shown in FIG. 14 (1), including only one reinforced coating film 1402) and double-sided coating (Double-sided hard coating (HC). As shown in FIG. 14 (2), including two reinforced coating films, 1402a and 1402b).

As shown in FIG. 15, in an embodiment, utilizing the reinforced coating film 1402 of a surface of the plastic cover. Specifically, as shown in FIG. 15 (1), the reinforced coating film 1402 is a single-sided HC plastic cover. As shown in FIG. 15 (2), the reinforced coating film 1402a is a double-sided HC plastic cover. The columnar array structure 154 shown in FIG. 15 can be achieved via a photo lithography or a fine pitch mask method. After that, processing the first OCA adhesive 151 coating process, to ensure that the liquid OCA adhesive fills the gap of the columnar structure. Then using a mold scraper or a temporary mucous mucosa to drain the excessive OCA adhesive, so that remains the first OCA adhesive 151 flat after curing. Wherein, an exceeding height $\Delta h$, a height exceeding a height of the columnar structure, $\Delta h<3$ μm. As shown in FIG. 15, wherein the plastic cover targeted to attached a target 153. An upper surface of the target 153 (usually a polarizer or a touch panel) is coated with a layer of OCA, that is, a second OCA 152. In order to ensure that the first OCA adhesive 151 can be adhered to the second OCA 152, a thickness of the second OCA 152, $h2<7$ μm. Which makes $\Delta h+h2<10$ μm possible. In this way, when the object is pressed against the plastic cover, a small amount of adhesive is extruded outward. The columnar structure can serve as a support by contacting the underlying polarizer or touch panel. The collapse caused by the pressing of the object located above is prevented. Indirectly, reduces the deformation of the plastic cover and improves the overall hardness.

Figure 16:
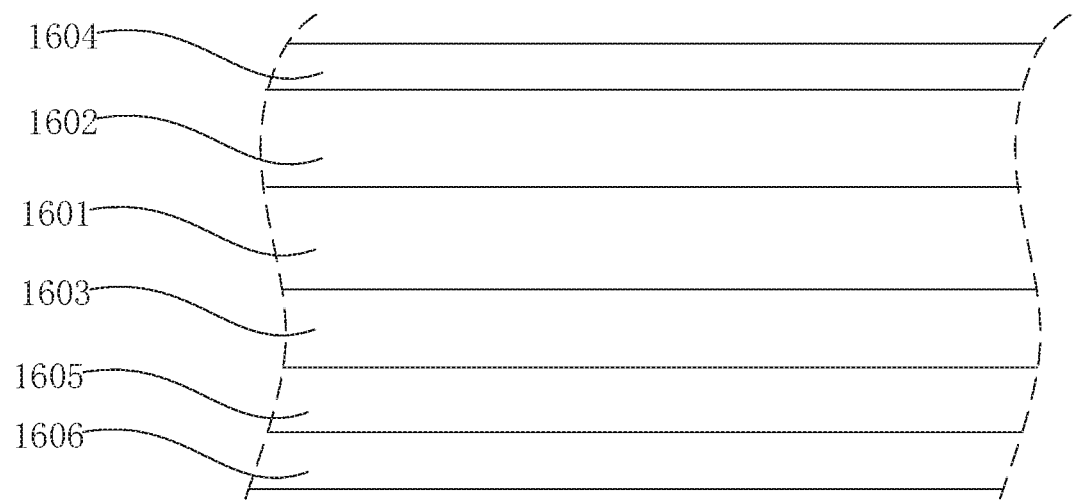
FIG. 16 is a schematic diagram of a polarizer according to an embodiment of the present disclosure.

As shown in FIG. 16, the polarizer including polyvinyl alcohol (PVA) 1601 having a polarizing effect. A first triacetyl cellulose acetate film (TAC) 1602 and a second triacety cellulose acetate film (TAC) 1603, which prevent moisture intrusion. A protective film 1604 disposed on an upper surface of the first triacetyl cellulose acetate film (TAC) 1602. A pressure sensitive adhesive (PSA) 1605 disposed on a lower surface of the second cellulose acetate film (TAC) 1603. A release film 1606 disposed on a lower surface of the pressure sensitive adhesive (PSA) 1605. After disposing the polarizer 160, the protective film 1604 and the release film 1606 will be removed.

Figure 17:
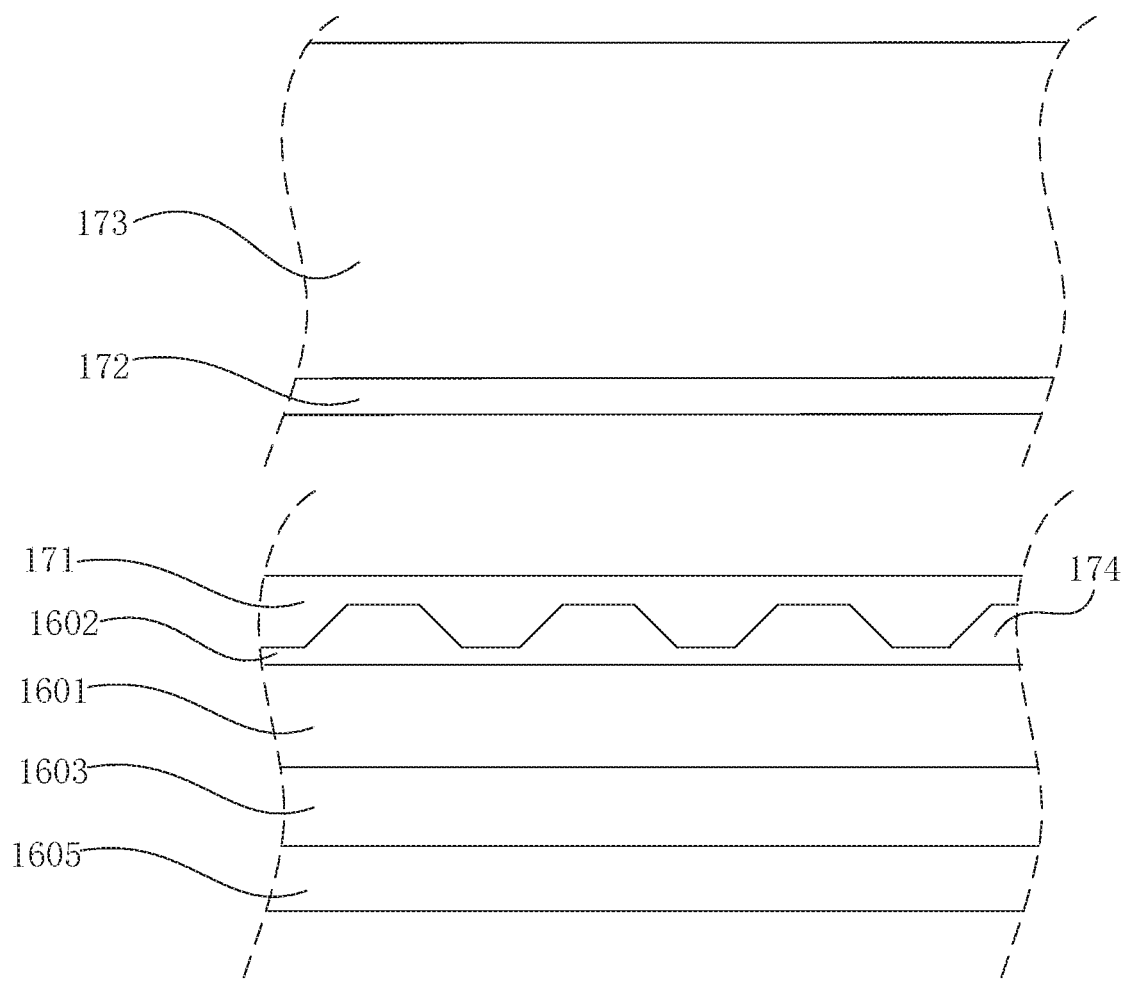
FIG. 17 is a second combination schematic diagram of the display device according to an embodiment of the present disclosure.

As shown in FIG. 17, in an embodiment, utilizing a chemical etching or mold forming process. After forming the columnar structure array 174 of the first cellulose acetate film (TAC) 1602. Processing a coating, squeeze the adhesive, and curing process of first OCA adhesive 171. Then, the second OCA adhesive 172 on the lower portion of the surface of the plastic cover 173 is butted against the first OCA adhesive 171. In this way, when the object presses the plastic cover, the columnar structure can serve as a support by contacting a bottom of the plastic cover, thereby improving the hardness.

According to the above embodiment, it can be known that:

The present disclosure provides a novel display device. The display device including a first functional member, a second functional member, including a support portion disposed on a surface oriented to the first functional member, the support portion used for supporting the first functional member when the display device is deformed, an adhesive layer disposed between the second functional member and the first functional member. Wherein the adhesive layer bonds the second functional member and the first functional member. A thickness of the adhesive layer is not less than a thickness of the support portion. Because of the thickness of the adhesive layer is not less than the thickness of the support portion, when the display device is not deformed, the adhesive layer which disposed between the support portion and the functional member functions to adhesive. When the display is disformed, such as the optical adhesive layer deformed to a certain degree. The support portion which disposed on the first functional member will in contact with the second functional member functions to support. At the same time, the adhesive layer will not continue to squeeze the adhesive out, so do not the collapse occur. Therefore, solves the technical problem that the optical adhesive collapse caused by excessive deformation of the prior art display.

In summary, although the present disclosure has been disclosed above in the preferred embodiments. However, the above preferred embodiments are not intended to limit the application. Various modifications and refinements can be made by those skilled in the art without departing from the spirit and scope of the present application. The scope of protection of the present disclosure is therefore defined by the scope of the claims.

What is claimed is:

1. A display device, comprising:
a first functional member;
a second functional member, comprising at least one support portion disposed on a surface of the second functional member facing the first functional member;
an adhesive layer disposed between the second functional member and the first functional member; wherein the adhesive layer bonds the second functional member and the first functional member;
wherein the first functional member further comprises at least one strut portion disposed on a surface of the first functional member facing the second functional member, the at least one support portion is alternately arranged with the at least one strut portion; and
wherein a thickness of the adhesive layer is not less than a thickness of the support portion and a thickness of the strut portion, and wherein a sum of the thickness of the support portion and the thickness of the strut portion is greater than the thickness of the adhesive layer.

2. The display device according to claim 1, wherein the adhesive layer is formed with at least one groove or one protrusion, a shape of the groove matches a shape of the at least one support portion, a shape of the protrusion is complementary to the shape of the at least one support portion.

3. The display device according to claim 1, wherein the at least one support portion is formed by protruding a surface of the second functional member.

4. The display device according to claim 1, wherein the at least one support portion is an independent member, the at least one support portion is adhered to a surface of the second functional member.

5. The display device according to claim 1, wherein the at least one support portion comprises a prismatic structure.

6. The display device according to claim 1, wherein the display device comprises a display area, and the at least one support portion is disposed in the display area.

7. The display device according to claim 1, wherein an installation position of the at least one support portion corresponds to an installation position of a pixel defining layer of a display panel in the display device.

8. The display device according to claim 7, wherein the display device is an organic light emitting diode display along a direction perpendicular to a surface of the display device, the at least one support portion coincides with a projection of the pixel defining layer on a surface of the display device.

9. The display device according to claim 1, wherein an installation position of the at least one support portion is opposite to an installation position of a data line of a display panel in the display device.

10. The display device according to claim 9, wherein the display device is a liquid crystal display, along a direction perpendicular to a surface of the display device, the at least one support portion coincides with a projection of the data line on a surface of the display device.

11. The display device according to claim 1, wherein an installation position of the at least one support portion is the same as an installation position of a light shielding layer of a display panel in the display device.

12. The display device according to claim 1, wherein in a direction perpendicular to a surface of the display device, the at least one support portion coincides with a projection of the light shielding layer on the surface of the display device.

13. The display device according to claim 1, wherein the at least one support portion comprises a columnar structure.

14. The display device according to claim 1, wherein the at least one support portion comprises a prismatic array structure.

15. The display device according to claim 1, wherein the at least one support portion comprises a columnar array structure.

16. The display device according to claim 1, wherein the first functional member is a protective cover disposed on a surface of the display device, the second functional member is a polarizer or a touch panel near the protective cover.

17. The display device according to claim 1, wherein the first functional member is a polarizer near a surface of the display device and the second functional member is a protective cover disposed on a surface of the display device.

* * * * *